United States Patent
Streiff et al.

(10) Patent No.: US 10,703,395 B2
(45) Date of Patent: Jul. 7, 2020

(54) METHOD AND DEVICE FOR MONITORING AN ELECTRIC NETWORK IN A RAIL VEHICLE AND RAIL VEHICLE

(71) Applicant: Bombardier Transportation GmbH, Berlin (DE)

(72) Inventors: Fabian Streiff, Wallisellen (CH); Gerhard Isepponi, Boppelsen (CH)

(73) Assignee: Bombardier Transportation GmbH, Berlin (DE)

( * ) Notice: Subject to any disclaimer, the term of this patent is extended or adjusted under 35 U.S.C. 154(b) by 382 days.

(21) Appl. No.: 15/507,441

(22) PCT Filed: Sep. 1, 2015

(86) PCT No.: PCT/EP2015/069885
§ 371 (c)(1),
(2) Date: Feb. 28, 2017

(87) PCT Pub. No.: WO2016/034548
PCT Pub. Date: Mar. 10, 2016

(65) Prior Publication Data
US 2017/0297593 A1   Oct. 19, 2017

(30) Foreign Application Priority Data

Sep. 1, 2014 (DE) .................. 10 2014 217 431

(51) Int. Cl.
*B61L 15/00*   (2006.01)
*B60L 13/04*   (2006.01)
(Continued)

(52) U.S. Cl.
CPC .......... *B61L 15/0081* (2013.01); *B60L 13/04* (2013.01); *B61B 13/08* (2013.01); *B61C 3/00* (2013.01);
(Continued)

(58) Field of Classification Search
CPC .. B61L 15/00; B61L 15/0018; B61L 15/0036; B61L 15/0054; B61L 15/0081
See application file for complete search history.

(56) References Cited

U.S. PATENT DOCUMENTS

| | | |
|---|---|---|
| 5,574,346 A | 11/1996 | Chavan et al. |
| 7,759,966 B2 | 7/2010 | Cawthorne et al. |

(Continued)

FOREIGN PATENT DOCUMENTS

| | | |
|---|---|---|
| CN | 103237697 A | 8/2013 |
| CN | 103430470 A | 12/2013 |

(Continued)

*Primary Examiner* — Robert J McCarry, Jr.
(74) *Attorney, Agent, or Firm* — The Webb Law Firm

(57) ABSTRACT

The invention relates to a device and a method for monitoring an electric network in a rail vehicle. The electric network includes at least one power converter, at least one permanent magnet machine, and at least one first phase line for the electrical connection of the at least one power converter and the at least one permanent magnet machine. The first phase line is interrupted. A potential difference is determined between a machine-side part of the first phase line and a reference potential and a potential-difference-dependent variable, wherein a speed of the permanent magnet machine and, as a function of the speed, a speed-dependent reference variable are determined. A deviation of the potential-difference-dependent variable from the speed-dependent reference variable is determined, wherein a network fault is detected if the deviation is greater than a predetermined threshold value.

20 Claims, 3 Drawing Sheets

(51) Int. Cl.
*B61B 13/08* (2006.01)
*B61C 3/00* (2006.01)
*B61L 27/04* (2006.01)
*G01R 31/00* (2006.01)
*G01R 31/02* (2006.01)

(52) U.S. Cl.
CPC ............ *B61L 27/04* (2013.01); *G01R 31/008* (2013.01); *G01R 31/024* (2013.01); *B60L 2200/26* (2013.01); *B61L 2201/00* (2013.01)

(56) References Cited

U.S. PATENT DOCUMENTS

| | | | |
|---|---|---|---|
| 9,647,598 | B2 | 5/2017 | Stuetzle |
| 2012/0242365 | A1* | 9/2012 | Singh ................... G01R 31/343 324/762.01 |

FOREIGN PATENT DOCUMENTS

| | | |
|---|---|---|
| DE | 102009038245 A1 | 5/2010 |
| DE | 102010063374 A1 | 6/2012 |
| DE | 102011012314 A1 | 8/2012 |
| DE | 102012223895 A1 | 6/2014 |
| EP | 2144345 A1 | 1/2010 |
| JP | 2013192300 A | 9/2013 |

\* cited by examiner

METHOD AND DEVICE FOR MONITORING AN ELECTRIC NETWORK IN A RAIL VEHICLE AND RAIL VEHICLE

CROSS-REFERENCE TO RELATED APPLICATIONS

This application is the United States national phase of International Application No. PCT/EP2015/069885 filed Sep. 1, 2015, and claims priority to German Patent Application No. 10 2014 217 431.7 filed Sep. 1, 2014, the disclosures of which are hereby incorporated in their entirety by reference.

BACKGROUND OF THE INVENTION

Field of the Invention

In rail vehicles, inter alia, so-called permanent magnet machines, which can also be referred to as permanent magnet motors, are used to drive the rail vehicle. They are generally supplied with electric energy via a three-phase electric network. The electric network also comprises a power converter in this case, which, in motor operation of the permanent magnet machine, converts a DC voltage, for example, a link circuit voltage, into a desired AC voltage for supplying the permanent magnet machine. The power converter can also, in generator operation of the permanent magnet machine, convert the AC voltage generated by the permanent magnet machine into a DC voltage.

Description of Related Art

Undesired short-circuits can occur in the electric network. They can occur both inside the permanent magnet machine, for example, inside a housing of the machine, or along a phase line for connecting the power converter and the permanent magnet machine. Short-circuits can also occur in the power converter. In the event of short-circuits, so-called electric arcs can also occur, which can result in undesired destruction of components of the rail vehicle.

Monitoring a level of a phase current is known, wherein a short circuit is detected if the level of the phase current exceeds a predetermined threshold value.

If such a short circuit is detected, in general the power converter is electrically disconnected from the permanent magnet machine, for example, by appropriately arranged circuit breakers. At the same time, the rail vehicle is decelerated to a standstill, to prevent a potential feed of the short-circuit.

The technical problem arises of providing a method and a device for monitoring an electric network in a rail vehicle and also a rail vehicle, which enable monitoring of the network even in the disconnected state of the electric machine.

SUMMARY OF THE INVENTION

The solution to the technical problem is disclosed herein.

A method is proposed for monitoring an electric network in a rail vehicle. The electric network can be in particular a traction network of the rail vehicle or can refer to a part of the traction network of the rail vehicle. The electric network is used in particular for energy transmission between a power converter of the rail vehicle and a permanent magnet machine of the rail vehicle.

The electric network comprises at least one power converter. The power converter can be operated in this case both as an inverter and also as a rectifier. For example, the power converter can be designed as a three-phase power converter.

The power converter can comprise in particular electric switching elements, for example, MOSFET or IGBT.

The power converter can be electrically connected on the input side to a link circuit, in particular a link circuit capacitor, of the rail vehicle. A link circuit voltage which drops via the link circuit capacitor, and which therefore is applied on the input side to the power converter, is a DC voltage. On the output side, the power converter can be connected to the permanent magnet machine, for example, via at least one phase line.

Furthermore, the electric network comprises the at least one permanent magnet machine. The permanent magnet machine refers in this case to a synchronous machine having a permanently magnetized rotor. The permanent magnet machine can be operated in motor operation. In this case, electric energy which is transmitted from the power converter to the permanent magnet machine is converted into mechanical energy. The electric energy is transmitted in this case in the form of an alternating current and an AC voltage, which feed the permanent magnet machine. In a generator operating mode, mechanical energy is converted by the permanent magnet machine into electric energy, wherein the electric energy can be transmitted to the power converter. In this case, the permanent magnet machine generates an alternating current and an AC voltage.

Furthermore, the electric network comprises at least one first phase line for the electrical connection of the at least one power converter and the at least one permanent magnet machine. The first phase line refers in this case to an electric line through which a first phase current can flow. The electric network preferably comprises more than one, in particular three phase lines. At least one electric switch element, for example, a power switch element, in particular a MOSFET, an IGBT, or a circuit breaker, can be arranged along the phase line. By means of the electric switch element of the first phase line, an electrical connection of the power converter and the permanent magnet machine via the first phase line can be interrupted or established.

The power converter is preferably a three-phase power converter, which is connected via three phase lines to a three-phase permanent magnet machine.

Furthermore, the first phase line is interrupted. For this purpose, as will also be explained in greater detail hereafter, a corresponding interruption unit can be actuated. The interruption unit is preferably designed as an electric switch element. The electric switch element can be arranged along the first phase line or in the first phase line. A connection of the power converter and the permanent magnet machine via the first phase line can be established or interrupted by means of the electric switch element. For example, the first phase line can be interrupted in that the electric switch element is opened.

Furthermore, a potential difference is determined between a machine-side part of the phase line and a reference potential. The reference potential can be, for example, a referencing potential, for example, a ground potential of the electric network. Alternatively, the reference potential can be the potential of a further phase line of the electric network, in particular of a machine-side part of this further phase line.

The machine-side part of the phase line refers in this case to a part or section of the phase line which connects a determination point of the potential difference to the permanent magnet machine. The determination point in turn refers to a point at or in which the potential difference is determined. The determination point can be equivalent to the interruption point, for example. The term "point" can also refer to a partial section of the phase line in this case, of course.

The determination of the potential difference comprises in this case the direct detection of the potential difference, for example, by means of a suitable detection unit, in particular by means of a voltage sensor. However, the term "determination" can also comprise the calculation of the potential difference as a function of at least one directly detected intermediate variable.

Furthermore, a potential-difference-dependent variable is determined. The potential-difference-dependent variable forms in this case an indicator of a level of the potential difference. Exemplary potential-difference-dependent variables will also be explained in greater detail hereafter.

Furthermore, a speed of the permanent magnet machine is determined. The speed can be detected directly in this case, for example, by means of a suitable detection unit, in particular a speed sensor. However, it is also possible to determine the speed by computation as a function of at least one directly detected variable, for example, a travel velocity of the rail vehicle. Of course, still further, in particular previously known, parameters of the rail vehicle can also be taken into consideration for this purpose, for example, transmission ratios of a mechanical connection of the permanent magnet machine and rotatable wheels of the rail vehicle.

Furthermore, a speed-dependent reference variable, which can also be referred to as a speed-dependent variable, is determined as a function of the speed. In this case, a relationship, for example, a functional relationship, between the speed and the speed-dependent variable can be previously known. The speed-dependent variable refers in this case to a variable corresponding to the potential-difference-dependent variable. In particular, the speed-dependent reference variable can form an indicator of a level of an idle voltage of the permanent magnet machine at a specific speed.

For example, it can be assumed that a linear relationship exists between the speed and the level of the idle voltage, wherein the idle voltage increases with rising speed.

Furthermore, a deviation of the potential-difference-dependent variable from the speed-dependent reference variable is determined. In particular, a difference can be determined between the speed-dependent reference variable and the potential-difference-dependent variable.

Furthermore, a network fault is detected if the deviation is greater than a predetermined threshold value. In particular, a network fault can thus be detected if the previously explained difference or an absolute value of the difference is greater than the predetermined threshold value. The predetermined threshold value can be zero in this case or can be a predetermined small amount greater than zero.

In this way, a network fault in a machine-side partial network, in particular in the permanent magnet machine, can advantageously be detected when the permanent magnet machine is electrically disconnected from the power converter. The machine-side partial network refers in this case to at least the part of the electric network which is arranged between a determination point of the electric network and the permanent magnet machine, wherein the permanent magnet machine itself is also part of the machine-side partial network. The machine-side partial network can therefore comprise at least the section of the first phase line which connects the above-explained determination point to the permanent magnet machine and also at least a part of the electric network of the permanent magnet machine.

Furthermore, a type of fault can be determined as a function of the level of the deviation, for example, the level of the above-explained difference. If a potential difference of zero or nearly zero is provided, for example, and therefore a high, in particular maximum, deviation of the potential-difference-dependent variable from the speed-dependent reference variable is provided, a short-circuit can thus be detected. However, if the determined potential difference is not equal to zero, but is less than the expected idle voltage, a deviation, but not a maximum deviation, of the potential-difference-dependent variable from the speed-dependent reference variable therefore exists. In this case, for example, an undesired low-impedance connection can be detected.

For example, a type of fault can be assigned to a predetermined deviation interval. If the deviation determined according to the invention is in one of the fault-dependent deviation intervals, the fault which is assigned to the corresponding fault-dependent deviation interval can thus be detected as the type of fault.

The method according to the invention can in particular only be carried out if the first phase line is interrupted. This can be the case, for example, if the phase line is already interrupted because of a further network fault, in particular a network fault in the power converter. An interruption can also be provided if a desired non-operation of the motor, for example, to save energy, is provided, wherein in this case the first line can also be interrupted. In the case of non-operation of the permanent magnet machine, for example, a further permanent magnet machine of the rail vehicle may take over the drive.

In a further embodiment, the electric network comprises three phase lines. Furthermore, at least two, in particular two of the three, or all phase lines are interrupted, and a potential difference between a machine-side part of the phase line and a reference potential is determined for each phase line. Furthermore, a potential-difference-dependent variable is determined in each case.

For this purpose, a potential difference between the phase line and a common reference potential, for example, a ground potential of the electric network, can be determined for each phase line. Alternatively and preferably, however, the potential of one of the remaining phase lines forms the reference potential for each phase line. This enables, as will also be explained in greater detail hereafter, only two voltage sensors to be used, for example, to determine a potential difference for each of three phase lines. In this case, the voltage sensors can each detect a potential difference between phase lines of a line pair, wherein line pairs differ in each case in at least one line of the two lines of the line pair.

Furthermore, as explained above, a speed of the permanent magnet machine and, as a function of the speed, a speed-dependent reference variable is determined for each phase line.

In a first alternative, a deviation of the potential-difference-dependent variable from the speed-dependent reference variable is determined for each phase line and a network fault is detected if at least one of the deviations is greater than a predetermined threshold value.

Alternatively or cumulatively, a minimum potential difference of all potential differences and a variable dependent on this minimum potential difference are determined. The variable dependent on the minimum potential difference is determined in this case like the above-explained potential-difference-dependent variable. Furthermore, a deviation of this variable, which is dependent on this minimum potential difference, from the speed-dependent reference variable is determined and a network fault is detected if this deviation is greater than a predetermined threshold value.

This advantageously has the result that a network fault can also be determined in a three-phase electrical network.

In a further embodiment, a two-phase network fault or a three-phase network fault is determined as a function of the potential differences and/or the at least one deviation.

If at least one of the deviations is greater than the predetermined threshold value and if at least one of the potential differences deviates from the remaining potential differences by more than a predetermined amount, a two-phase network fault can thus be detected. Such a two-phase network fault can be a short-circuit between two phases, for example. Such a two-phase network fault can also be detected if at least one deviation is greater than the predetermined threshold value, but a further deviation is less than or equal to the predetermined threshold value.

A three-phase network fault, for example, a short-circuit between all phases, can be detected if at least one deviation is greater than the predetermined threshold value and all potential differences are equal. A three-phase network fault can also be detected if all deviations are greater than the predetermined threshold value.

A type of the network fault can advantageously be determined in this way.

In a further embodiment, a speed of the permanent magnet machine is reduced upon detection of a network fault. A rotor of the permanent magnet machine can be braked for this purpose, for example. However, the rail vehicle can preferably be braked by means of at least one braking unit for this purpose. Of course, the speed of the permanent magnet machine can be reduced to zero. The reduction of the speed advantageously has the result that a short-circuit is not still fed by the permanent magnet machine. The risk of undesired damage can be reduced in this way.

Alternatively or cumulatively, a further interruption of the machine-side part of the phase line can be carried out. In particular, the electrical connection between the phase line and a connection point of the permanent magnet machine can be interrupted, in particular in the connection point of the permanent magnet machine. It is also conceivable that the phase line comprises a further electric switch element, which is arranged in the machine-side part of the phase line. The further interruption can be performed in this case by opening the further electric switch element.

A fault location, which is located in the machine-side part of the phase line, can be electrically isolated by a further interruption of the machine-side part of the phase line.

Preferably, an interruption as close as possible to the machine of the machine-side part of the phase line is carried out. In particular, a distance of an interruption point from the connection point of the phase line to the permanent magnet machine can be less than a predetermined distance.

In a further embodiment, an accuracy of the determination of the potential difference is checked. If, as explained in greater detail hereafter, a determination unit is used for determining the potential difference, a functionality of this determination unit can thus be checked in this way. The accuracy of the determination of the potential difference is checked in that in the case of an uninterrupted phase line, at least one normal operating potential difference is determined and a deviation of the normal operating potential difference from a normal operating reference value is determined. A sufficient accuracy is detected if the deviation is less than or equal to a predetermined threshold value. A deviation of the normal operating potential difference from a normal operating reference value can also be determined in particular in that, as a function of the normal operating potential difference, a potential-difference-dependent variable is determined and, as a function of the normal operating reference value, a corresponding reference variable is determined, wherein a deviation of the potential-difference-dependent variable from the corresponding reference variable is determined.

The normal operating reference value can be equal to the link circuit voltage, for example. In particular, the normal operating potential difference corresponds to a potential difference to be expected under normal operating conditions, which can be determined computationally, for example. The accuracy of the determination of the potential difference can be determined, for example, as a function of present operating parameters of the electrical network. In this case, the normal operating potential difference can be determined as a function of the present operating parameters, for example, as a function of switch states of the switch elements of the power converter.

It is presumed in this case that the accuracy of the determination of the potential difference is provided in the case of an interrupted phase line if a correct determination is performed in the case of an uninterrupted phase line.

Alternatively or cumulatively, the accuracy of the determination of the potential difference can be checked in that a standstill of the permanent magnet machine is detected, wherein at least one standstill potential difference is detected in the case of an uninterrupted phase line, wherein a deviation of the standstill potential difference from a standstill reference value is determined, wherein a sufficient accuracy is detected if the deviation is less than or equal to a predetermined threshold value. A deviation of the standstill potential difference from a standstill reference value can in particular also be determined in that a potential-difference-dependent variable is determined as a function of the standstill potential difference and a corresponding reference variable is determined as a function of the standstill reference value, wherein a deviation of the potential-difference-dependent variable from the corresponding reference variable is determined.

In general, it is possible that an output signal which represents or codes the potential difference or the potential-difference-dependent variable is inversely proportional to a level of the potential difference or the potential-difference-dependent variable. This means that a high signal level or a high output signal is generated if a low potential difference is determined. At a standstill of the permanent magnet machine, the potential difference to be expected has a low value according to expectation, theoretically a value of zero. Therefore, a high output signal can be expected. However, a lower output signal than the expected output signal can be generated at a standstill as a result of faults in a determination unit. Therefore, faults of the determination unit, for example, electronics faults, can advantageously be detected.

In a further embodiment, the speed is associated with one speed interval of multiple speed intervals, wherein an interval-dependent reference variable is assigned to one speed interval, wherein the speed-dependent reference variable is determined as the interval-dependent reference variable.

A method which is simple to carry out by computation advantageously results in this way.

In a further embodiment, the potential difference is assigned to one potential difference interval of multiple potential difference intervals, wherein an interval-dependent potential difference value is assigned to one potential difference interval. The interval-dependent potential difference value can be, for example, a minimum or a maximum value of the potential difference interval. Furthermore, the potential-difference-dependent variable is determined as a function of the interval-dependent potential difference value. Carrying out the method by computation is also advantageously simplified in this way. In particular, however, one of the types of faults explained above can be assigned to one or more potential difference intervals. A simplified classification of a type of fault therefore advantageously results.

In a further embodiment, a potential difference between a machine-side part of the phase line and a reference potential and a potential-difference-dependent variable is determined for each phase line. Furthermore, a combined output signal is formed, wherein the combined output signal comprises a first bit sequence, which codes the potential-difference-dependent variable formed from the minimum potential difference. This bit sequence can comprise a predetermined number of bits, for example, 3 bits. Furthermore, the combined output signal comprises a further bit sequence, which codes an equality of all potential differences. The further bit sequence can in particular consist of precisely one bit, wherein one of the two states of the bit, for example, the state "1" or the state "0," codes an equality of all potential differences.

A simple coding of the output signal advantageously results in this way, which simplifies a detection of a network fault, on the one hand, and the detection of a three-phase or two-phase network fault, on the other hand.

In a further embodiment, the potential-difference-dependent variable is a maximum amplitude or an RMS value of the potential difference during a predetermined determination duration. The determination duration can be, for example, in an interval of 10 ms to 100 ms. The determination duration is preferably 100 ms.

The potential-difference-dependent variable can be provided in this case as a digital signal. The potential-difference-dependent variable can also be generated as inversely proportional to the level of the potential difference.

Furthermore, the speed-dependent variable can additionally be determined as a function of a temperature of the permanent magnet machine. Alternatively or cumulatively, the speed-dependent reference variable can be determined as a function of an age of the permanent magnet machine. It can be presumed in this case that the idle voltage generated by the permanent magnet machine as a function of the speed is additionally a function of the operating temperature of the permanent magnet machine and/or a function of an age of the permanent magnet machine. The proposed method can therefore be improved further in its accuracy and reliability.

Furthermore, a device for monitoring an electric network in a rail vehicle is proposed. The electric network can be designed as explained above in this case.

The device comprises at least one evaluation unit, at least one determination unit, and at least one interruption unit. The first phase line is interruptible by means of the interruption unit. A potential difference between a machine-side part of the phase line and a reference potential is determinable by means of the determination unit.

Furthermore, a potential-difference-dependent variable is determinable. The potential-difference-dependent variable can be determined in this case, for example, by the determination unit. The potential-difference-dependent variable can thus be provided, for example, in the form of an output signal, in particular a digital output signal, of the determination unit. Alternatively, the potential-difference-dependent variable can also be determined by the evaluation unit, however.

The evaluation unit and the at least one determination unit have a data and/or signal connection in this case. The evaluation unit and the determination unit can also be formed as a joint unit.

Furthermore, a speed of the permanent magnet machine and, as a function of the speed, a speed-dependent reference variable are determinable. The device can comprise a speed determination unit in this case.

The determination of the speed-dependent reference variable can also be carried out in this case by means of the determination unit or by means of the evaluation unit.

Furthermore, a deviation of the potential-difference-dependent variable from the speed-dependent reference variable is determinable by means of the evaluation unit. Furthermore, a network fault is detectable if the deviation is greater than a predetermined threshold value.

The device advantageously enables one of the above-described methods to be carried out. The device is therefore designed such that the method according to one of the above-explained embodiments can be carried out by means of the device.

In one preferred embodiment, the potential difference is determined close to the motor. This can mean that a determination point for the determination of the potential difference is not situated spaced apart by more than a predetermined distance from a connection point of the phase line to the permanent magnet machine, wherein the distance is measured along the phase line.

In this way, a very low probability of an incorrect detection of a network fault as a result of a fault in the wiring between voltage sensor and permanent magnet sensor advantageously results.

Furthermore, a rail vehicle is proposed, wherein the rail vehicle comprises a device according to one of the above-explained embodiments. A rail vehicle advantageously results in this way, the operational reliability of which is increased.

BRIEF DESCRIPTION OF THE DRAWINGS

The invention will be explained in greater detail on the basis of an exemplary embodiment. In the figures.

Hereafter, identical reference signs identify elements having identical or similar technical features.

DETAILED DESCRIPTION OF THE INVENTION

Figure 1:
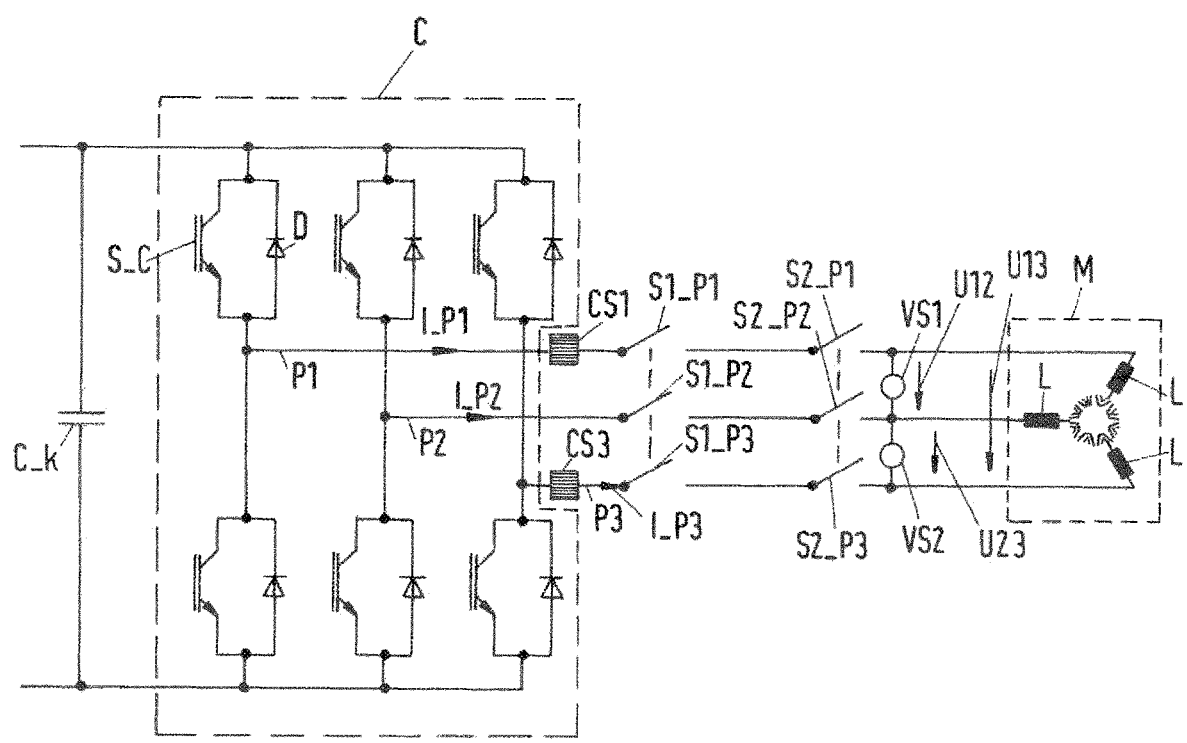
FIG. 1 shows a schematic circuit diagram of an electric network of a rail vehicle.

FIG. 1 shows an electric network 1 of a rail vehicle (not shown). The electric network 1 comprises a power converter C and a permanent magnet machine M, wherein inductors L of the permanent magnet machine M are shown by way of example. Furthermore, the electric network 1 comprises a link circuit capacitor C_k. The power converter C is connected on the input side to a link circuit capacitor C_k.

The power converter C is a three-phase power converter in this case. It comprises six electric switch elements S_C, to each of which a freewheel diode D is electrically connected in parallel. For the sake of comprehensibility, only one electric switch element S_C and one diode D of the power converter C are provided with a reference sign.

Furthermore, the electric network 1 comprises three phase lines P1, P2, P3. Furthermore, phase currents I_P1, I_P2, and I_P3, are shown, which illustrate a current flow through the corresponding phase line P1, P2, P3.

Furthermore, the electric network 1 comprises a first current sensor CS1 and a further current sensor CS3, wherein the first current sensor CS1 detects the first phase current I_P1 and the further current sensor CS3 detects the third phase current I_P3.

By means of the phase lines P1, P2, P3, the power converter C is connected on the output side to the permanent magnet machine M. The permanent magnet machine M is therefore a three-phase electric machine.

A first electric switch element S1_P1 and a second electric switch element S2_P1 are arranged in the first phase line P1. By opening and closing these two switch elements S1_P1, S2_P1, the electrical connection via the first phase line P1 between the power converter C and the permanent magnet machine M can be established or interrupted. In a closed state of the switch elements S1_P1, S2_P1, the electrical connection is established in this case. If at least one of the two switch elements S1_P1, S2_P1 is opened, the electrical connection is thus interrupted. In this case, the first switch element S1_P1 can designate a so-called motor switch. The second switch element S2_P1 can designate a further motor switch.

Accordingly, a first electric switch element S1_P2, S1_P3 and a second electric switch element S2_P2, S2_P3 are respectively also arranged in further phase lines P2, P3.

Furthermore, a first voltage sensor VS1 and a second voltage sensor VS2 are shown. The first voltage sensor VS1 detects a voltage U12, i.e., a potential difference, between the first phase line P1 and the second phase line P2. Accordingly, the second voltage sensor VS2 detects a voltage U23 between the second phase line P2 and the third phase line P3.

To monitor the electric network 1, at least one electric switch element, preferably both electric switch elements S1_P1, ..., S2_P3, of each phase line P1, P2, P3 is/are opened. The voltages U12, U23 are then detected and a voltage U13 between the first phase line P1 and the third phase line P3 is calculated.

Furthermore, a speed d (see FIG. 2) of the permanent magnet machine M is determined.

Furthermore, a voltage-dependent variable is determined for each of the voltages U12, U23, U13, for example, a maximum absolute value during a predetermined time interval of 100 ms, which follows a determination start time, for example.

A speed-dependent reference variable is determined as a function of the speed d of the permanent magnet machine M. The reference variable corresponds in this case to the voltage-dependent variable. For example, the speed-dependent reference variable can be a minimum absolute value of an idle voltage of the permanent magnet machine M in the predetermined time interval of 100 ms.

Figure 2:
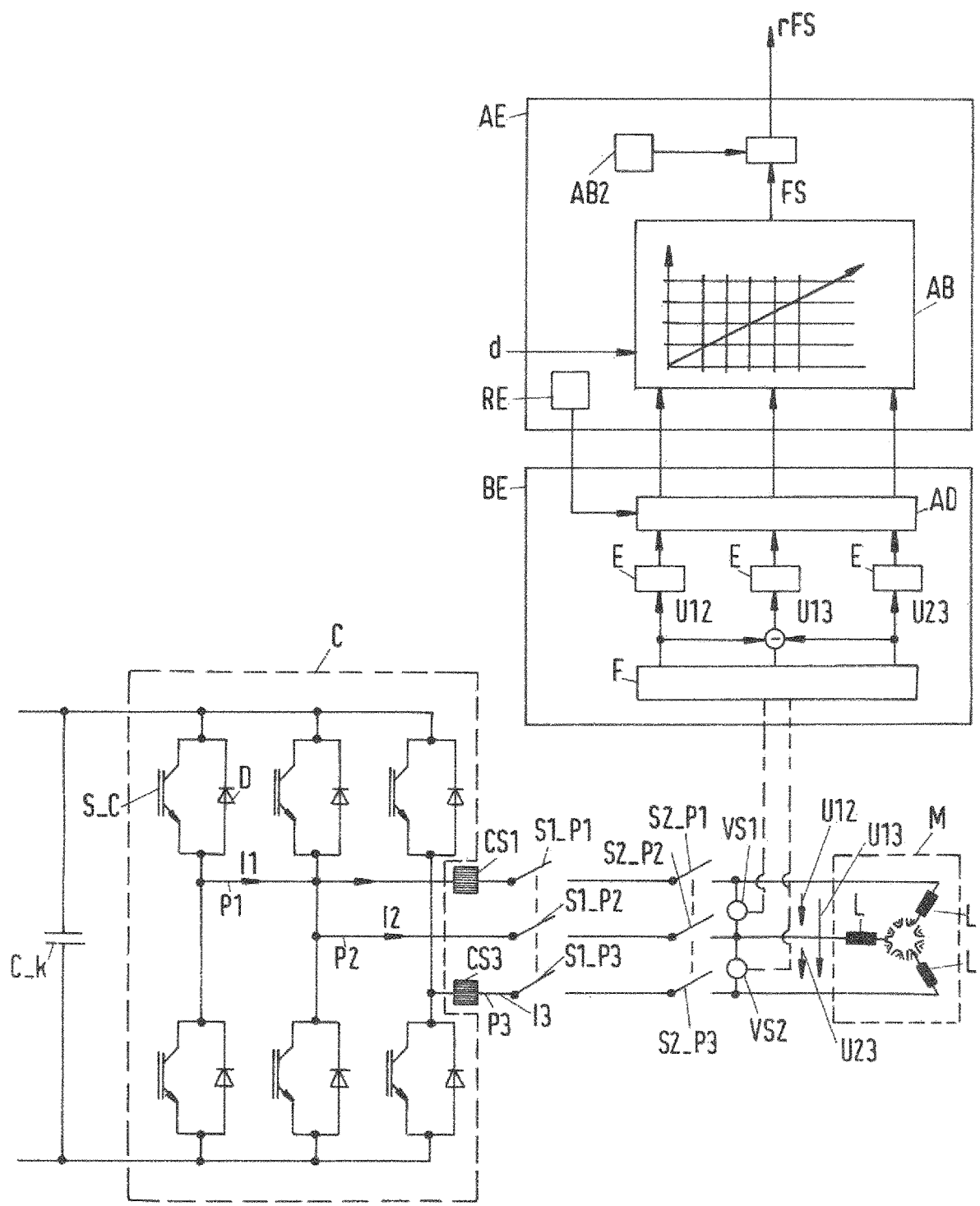
FIG. 2 shows a schematic block diagram of a device according to the invention.

As explained in greater detail in FIG. 2, a difference is then determined between the speed-dependent reference variable and the voltage-dependent variable and a network fault is detected if the difference is greater than a predetermined threshold value, in particular greater than zero.

FIG. 2 shows the electric network 1 from FIG. 1 and a determination unit BE and an evaluation unit AE. Reference is made in this case to the statements on FIG. 1 with respect to the design of the electric network 1.

The determination unit BE which can be designed as a microcontroller or parts thereof, for example, has a signal connection to the voltage sensors VS1, VS2. The voltage U12 between the first phase line P1 and the second phase line P2 and the voltage U23 between the second phase line P2 and the third phase line P3 form input signals for the determination unit BE. These are filtered by a filter unit F. Furthermore, it is shown that after the filtering, a difference calculation is performed to determine the voltage U13 between the first phase line P1 and the third phase line P3. In the units E, a maximum absolute value of an amplitude of the voltages U12, U23, U13 in an interval of 100 ms is determined to determine the voltage-dependent variable. In an A/D converter AD, a digitization of this voltage-dependent variable is performed. In this case, the digitalization is performed inversely proportional to a level of the voltage-dependent variables. In particular, a value of the voltage-dependent variable of zero is coded using the highest digital value. The digitization can be performed using a Gray code.

These digital values, which represent the voltage-dependent variables, form output signals of the determination unit BE and input signals of the evaluation unit AE, which has a data connection to the determination unit BE. A further input signal of the evaluation unit AE is a speed d of the permanent magnet machine M. Via a previously known relationship, which is shown by way of example in the evaluation block AB in FIG. 2, the evaluation unit AE determines a speed-dependent reference variable Vref (see FIG. 3).

Furthermore, it is determined whether the speed-dependent reference variable Vref is greater by more than a predetermined amount than each of the transmitted voltage-dependent variables. If the speed-dependent reference variable Vref is greater than at least one of the transmitted voltage-dependent variables, a fault signal FS is thus generated. It is furthermore shown in FIG. 2 that it is checked by a further evaluation block AB2 whether the permanent magnet machine M is not connected to the power converter C, for example, whether all switches S1_P1, ..., S2_P3 are open. It can also be checked whether no feedback signal, which can also be referred to as a "life signal," from a traction control unit (not shown) is provided. For example, it can be detected that the switches S1_P1, ..., S2_P3 are open if such a feedback signal is not provided.

If at least one of the conditions is met, a resulting fault signal rFS is thus output by the evaluation unit AE. A corresponding protective measure can then be initiated as a function of this resulting fault signal rFS.

Furthermore, a reference signal generation unit RE is shown, which is part of the evaluation unit AE. It transmits a reference signal, for example, a step signal, to the digital converter AD. This can be performed, for example, during startup of the evaluation unit AE and the determination unit BE. A functionality of the digital converter AD can be checked in this way.

To check the functionality, it can also be checked whether a bit pattern of the digitized output signal of the determination unit DE changes by at most 1 bit, in particular if a so-called Gray code is used for the digitization.

It is not shown that a further electric network can also be monitored by the determination unit BE and the evaluation unit AE, which also comprises, for example, a power converter C, phase lines, P1, P2, P3, and a permanent magnet machine M. The determination unit BE and the evaluation unit AE can thus be used to monitor multiple electric networks, which each comprise a permanent magnet machine M for the drive of the rail vehicle. It is also conceivable that multiple permanent magnet machines of a railroad truck are monitored.

Figure 3:
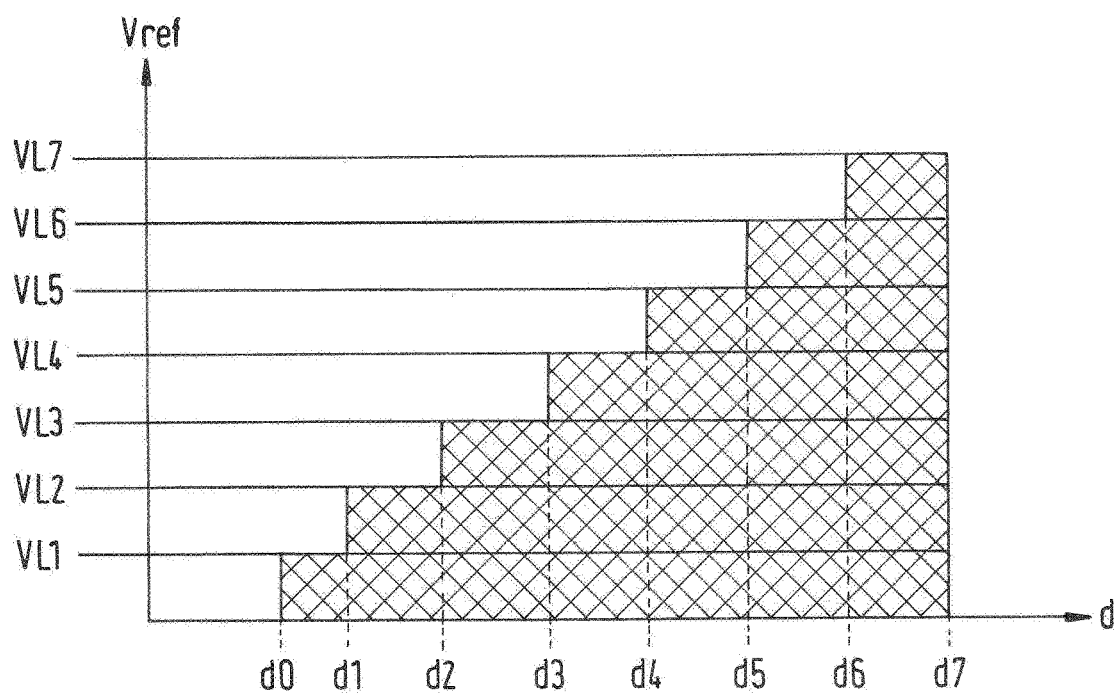
FIG. 3 shows a schematic illustration of speed intervals and voltage intervals.

FIG. 3 schematically shows a relationship between a speed d and a speed-dependent reference variable Vref. The speed-dependent reference variable Vref can be a voltage in particular. The voltage induced at a specific speed d is approximately linearly dependent on the motor speed. However, aging influences and temperature, in particular a magnet temperature, can influence the induced voltage. Thus, for example, the speed-dependent reference variable Vref can be defined as a minimum speed-dependent voltage, which is induced at a maximum occurring magnet temperature in normal operation. Alternatively or cumulatively, the speed-dependent reference variable Vref can also be determined as a function of the age of the permanent magnet machine, wherein the speed-dependent reference variable decreases with increasing age. This relationship can be previously known, however. A reliability and a robustness of the method can advantageously be increased in this way.

Furthermore, it is shown that as a result of the digitization, the speed d can be assigned to one speed interval of multiple speed intervals, wherein the speed intervals are delimited by predetermined speeds d0, d1, d2, d3, d4, d5, d6, d7. An interval-dependent reference variable VL1, VL2, VL3, VL4, VL5, VL6, VL7 is assigned to each speed interval. For example, a first interval-dependent reference variable VL1 is assigned to a first speed interval, which lies between the first speed d0 and a second speed d1. If the speed is thus in this speed interval, the speed-dependent reference variable Vref is thus determined as this interval-dependent reference variable VL1.

The invention claimed is:

1. A method for monitoring an electric network in a rail vehicle, wherein the electric network comprises at least one power converter, at least one permanent magnet machine, and at least one phase line for an electrical connection of the at least one power converter and the at least one permanent magnet machine, the method comprising:
   determining a potential difference between a machine-side part of the at least one phase line and a reference potential;
   determining a potential-difference-dependent variable based on the potential difference;
   determining a speed of the permanent magnet machine;
   determining, as a function of the speed, a speed-dependent reference variable;
   determining a deviation of the potential-difference-dependent variable from the speed-dependent reference variable; and
   detecting a network fault if the deviation is greater than a predetermined threshold value.

2. The method as claimed in claim 1, wherein upon detection of a network fault, a speed of the permanent magnet machine is reduced and/or a further interruption of the machine-side part of the phase line is carried out.

3. The method as claimed in claim 1, wherein an accuracy of the determination of the potential difference is checked in that at least one normal operating potential difference is determined in the case of an uninterrupted phase line, wherein a deviation of the normal operating potential difference from a normal operating reference value is determined, wherein a sufficient accuracy if the deviation is less than or equal to a predetermined threshold value and/or in that a standstill of the permanent magnet machine is detected, wherein at least one standstill potential difference is detected in the case of an interrupted phase line, wherein a deviation of the standstill potential difference from a standstill reference value is determined, wherein a sufficient accuracy if the deviation is less than or equal to a predetermined threshold value.

4. The method as claimed in claim 1, wherein the speed is assigned to one speed interval of multiple speed intervals, wherein an interval-dependent reference variable is assigned to one speed interval, wherein the speed-dependent reference variable is determined as the interval-dependent reference variable.

5. The method as claimed in claim 1, wherein the potential difference is assigned to one potential difference interval of multiple potential difference intervals, wherein an interval-dependent potential difference value is assigned to one potential difference interval, wherein the potential-difference-dependent variable is determined as a function of the interval-dependent potential difference value.

6. The method as claimed in claim 1, wherein a potential difference between a machine-side part of the phase line and a reference potential and a potential-difference-dependent variable is determined for each phase line, wherein a combined output signal is formed, wherein the combined output signal comprises a first bit sequence, which codes the potential-difference-dependent variable formed from the minimum potential difference, wherein the combined output signal comprises a further bit sequence, which codes an equality of all potential differences.

7. The method as claimed in claim 1, wherein the potential-difference-dependent variable is a maximum amplitude or an RMS value of the potential difference during a predetermined determination duration.

8. The method of claim 1, wherein the electric network comprises three phase lines, the method further comprising:
   determining a potential difference between a machine-side part of a phase line and a reference potential for each phase line;
   determining a speed of the permanent magnet machine and, as a function of the speed of the permanent magnet machine, a speed-dependent reference variable for each phase line;
   determining a potential-difference-dependent variable; and
   determining a deviation of the potential-difference-dependent variable from the speed-dependent reference variable for each phase line.

9. The method of claim 8 further comprising:
   detecting a network fault based on at least one of the deviations of the potential-difference-dependent variable from the speed-dependent reference variable for each phase line being greater than a second predetermined threshold value.

10. The method of claim 8 further comprising:
    determining a minimum potential difference of all potential differences and a variable dependent on the minimum potential difference,
    determining a deviation of the variable dependent on the minimum potential difference from the speed-dependent reference variable for each phase line; and
    detecting a network fault based on the deviation of the variable dependent on the minimum potential difference from the speed-dependent reference variable being greater than a second predetermined threshold value.

11. The method of claim 10 further comprising:
    detecting a two-phase network fault or a three-phase network fault as a function of the potential differences and/or the deviation of the variable dependent on the minimum potential difference from the speed-dependent reference variable for each phase line.

12. A device for monitoring an electric network in a rail vehicle,
wherein the device comprises:
at least one evaluation unit,
at least one determination unit, and
at least one interruption unit,
wherein at least one phase line of the electric network is interruptible by the at least one interruption unit,
wherein a potential difference between a machine-side part of the at least one phase line and a reference potential is determinable by the determination unit,
wherein a potential-difference-dependent variable is determinable by the determination unit or the evaluation unit,
wherein a speed of a permanent magnet machine of the electric network is determinable by the determination unit and, as a function of the speed, a speed-dependent reference variable is determinable by the determination unit or the evaluation unit,
wherein a deviation of the potential-difference-dependent variable from the speed-dependent reference variable is determinable by the evaluation unit, and
wherein a network fault is detectable by the evaluation unit if the deviation of the potential-difference-dependent variable from the speed-dependent reference variable is greater than a predetermined threshold value.

13. The device as claimed in claim 12, wherein the potential difference between the machine-side part of the at least one phase line and the reference potential is determined close to a motor.

14. A rail vehicle comprising a device as claimed in claim 13.

15. A rail vehicle comprising a device as claimed in claim 12.

16. The device of claim 12, wherein a potential difference between a machine-side part of each phase line of the electric network and a reference potential is determinable by the determination unit for each phase line of the electric network;
wherein a speed-dependent reference variable is determinable by the determination unit for each phase line of the electric network;
wherein a potential-difference-dependent variable and a deviation of the potential-difference-dependent variable from the speed-dependent reference variable are determinable by the determination unit for each phase line; and
wherein a network fault is detectable by the determination unit if at least one of the deviations is greater than a second predetermined threshold value.

17. The device of claim 16, wherein the predetermined threshold value and the second predetermined threshold value are equal.

18. The device of claim 12, wherein a minimum potential difference of all potential differences and a variable dependent on the minimum potential difference are determinable by the determination unit;
wherein a deviation of the variable dependent on the minimum potential difference from the speed-dependent reference variable is determinable by the determination unit; and
wherein a network fault is detectable by the determination unit if the deviation of the variable dependent on the minimum potential difference from the speed-dependent reference variable is greater than a second predetermined threshold value.

19. The device of claim 18, wherein a two-phase network fault or a three-phase network fault is detectable by the determination unit as a function of the potential differences and/or the deviation of the variable dependent on the minimum potential difference from the speed-dependent reference variable.

20. The device of claim 18, wherein the predetermined threshold value and the second predetermined threshold value are equal.

* * * * *

UNITED STATES PATENT AND TRADEMARK OFFICE
CERTIFICATE OF CORRECTION

PATENT NO. : 10,703,395 B2
APPLICATION NO. : 15/507441
DATED : July 7, 2020
INVENTOR(S) : Fabian Streiff et al.

Page 1 of 1

It is certified that error appears in the above-identified patent and that said Letters Patent is hereby corrected as shown below:

In the Claims

Column 11, Line 62, Claim 3, after "accuracy" insert -- is detected --

Column 12, Line 2, Claim 3, after "accuracy" insert -- is detected --

Signed and Sealed this
Tenth Day of November, 2020

Andrei Iancu
*Director of the United States Patent and Trademark Office*